United States Patent
Walukiewicz et al.

(10) Patent No.: US 8,232,470 B2
(45) Date of Patent: Jul. 31, 2012

(54) DILUTE GROUP III-V NITRIDE INTERMEDIATE BAND SOLAR CELLS WITH CONTACT BLOCKING LAYERS

(75) Inventors: Wladyslaw Walukiewicz, Kensington, CA (US); Kin Man Yu, Lafayette, CA (US)

(73) Assignee: Rosestreet Labs Energy, Inc., Phoenix, AZ (US)

( * ) Notice: Subject to any disclaimer, the term of this patent is extended or adjusted under 35 U.S.C. 154(b) by 0 days.

(21) Appl. No.: 12/558,446

(22) Filed: Sep. 11, 2009

(65) Prior Publication Data

US 2010/0175751 A1   Jul. 15, 2010

(51) Int. Cl.
 *H01L 31/00* (2006.01)
(52) U.S. Cl. .................................. 136/262; 136/252
(58) Field of Classification Search .................. 136/244, 136/262, 252, 256, 258; 257/102, 191, 192, 257/194, 200, 442
See application file for complete search history.

(56) References Cited

U.S. PATENT DOCUMENTS

| | | | | |
|---|---|---|---|---|
| 4,315,096 | A * | 2/1982 | Tyan et al. | 136/244 |
| 4,453,173 | A * | 6/1984 | Carlson et al. | 257/53 |
| 2003/0042846 | A1* | 3/2003 | Forrest et al. | 313/503 |
| 2006/0039432 | A1 | 2/2006 | Ha et al. | |
| 2009/0014061 | A1 | 1/2009 | Harris et al. | |
| 2009/0277503 | A1* | 11/2009 | Ludowise | 136/256 |

FOREIGN PATENT DOCUMENTS

| JP | 05-110138 | 4/1993 |
|---|---|---|
| JP | 05-110138 A | 4/1993 |

OTHER PUBLICATIONS

Shao et al. "Intermediate-band solar cells based on quantum dot supracrystals," Applied Physics Letters 91, 163503 (2007) and Forrest et al. (U.S. Publication No. 2003/0042846).*
Geisz et al., "III-N-V semiconductors for solar photovoltaic applications," Semiconductor Science and Technology, 17 (2002) 769-777.*
Walukiewicz et al., "Nitrogen-Induced Modification of the Electronic Structure of Group III-N-V Alloys," National Renewable Energy Laboratory, Apr. 1999.*

(Continued)

*Primary Examiner* — Jennifer Michener
*Assistant Examiner* — Eli Mekhlin
(74) *Attorney, Agent, or Firm* — Greenberg Traurig, LLP (57) ABSTRACT

An intermediate band solar cell (IBSC) is provided including a p-n junction based on dilute III-V nitride materials and a pair of contact blocking layers positioned on opposite surfaces of the p-n junction for electrically isolating the intermediate band of the p-n junction by blocking the charge transport in the intermediate band without affecting the electron and hole collection efficiency of the p-n junction, thereby increasing open circuit voltage ($V_{OC}$) of the IBSC and increasing the photocurrent by utilizing the intermediate band to absorb photons with energy below the band gap of the absorber layers of the IBSC. Hence, the overall power conversion efficiency of a IBSC will be much higher than an conventional single junction solar cell. The p-n junction absorber layers of the IBSC may further have compositionally graded nitrogen concentrations to provide an electric field for more efficient charge collection.

18 Claims, 8 Drawing Sheets

OTHER PUBLICATIONS

Tablero, "Survey of intermediate band materials based on ZnS and ZnTe semiconductors," Solar energy Materials & Solar Cells 90 (2006) 588-596.*

Dharmarasu et al., "Effects of proton irradiation on n+p InGaP solar cells," Journal of Applied Physics, vol. 90, No. 5 (2002) 3306.*

Marti et al., IBPOWER: Intermediate band materials and solar cells for photovoltaics with high efficiency and reduced cost, Proc. 34th IEEE PVSC, Philadelphia-USA (2009).*

Cuadra et al., Thin Solid Films, 451-451 (2004) 593-599.*

Ekin-Daukes, et al., "Signature of Intermediate Band Materials from Luminescence Measurements," Presented at the 31st IEEE Photovoltaic Specialists Conference, Jan. 2005.*

Levy et al., "Quantum Dot Intermediate Band Solar Cell Material Systems with Negligible Valence Band Offsets," Presented at the 31st IEEE Photovoltaic Specialists Conference, Jan. 2005.*

Algora et al., IEEE Transactions on Electronic Devices, vol. 48, No. 5, May 2001.*

Form PCT/ISA/210 in connection with PCT/US2010/048014 dated Jun. 1, 2010.

Form PCT/ISA/237 in connection with PCT/US2010/048014 dated Jun. 1, 2010.

International Preliminary Report on Patentability based on PCT/2010/048014 dated Mar. 13, 2012.

* cited by examiner

DILUTE GROUP III-V NITRIDE INTERMEDIATE BAND SOLAR CELLS WITH CONTACT BLOCKING LAYERS

STATEMENT OF GOVERNMENTAL INTEREST

The invention described and claimed herein was made in part utilizing funds supplied by the U.S. Department of Energy under Contract No. DE-AC02-05CH11231. The government has certain rights in this invention.

BACKGROUND OF THE INVENTION

1. Field of the Invention

The disclosure relates to solar cells and, more particularly, to dilute Group III-V nitride intermediate band solar cells with contact blocking layers to be used for improved solar cell performance.

2. Background Discussion

Solar or photovoltaic cells are semiconductor devices having P-N junctions which directly convert radiant energy of sunlight into electrical energy. Conversion of sunlight into electrical energy involves three major processes: absorption of sunlight into the semiconductor material; generation and separation of positive and negative charges creating a voltage in the solar cell; and collection and transfer of the electrical charges through terminals connected to the semiconductor material. A single depletion region for charge separation typically exists in the P-N junction of each solar cell.

Current traditional solar cells based on single semiconductor material have an intrinsic efficiency limit of approximately 31%. A primary reason for this limit is that a semiconductor has a specific energy gap that can only absorb a certain fraction of the solar spectrum with photon energies ranging from 0.4 to 4 eV. Light with energy below the bandgap of the semiconductor will not be absorbed and converted to electrical power. Light with energy above the bandgap will be absorbed, but electron-hole pairs that are created quickly lose their excess energy above the bandgap in the form of heat. Thus, this energy is not available for conversion to electrical power.

Solar cells with higher efficiencies can be achieved by using stacks of solar cells made of semiconductors with different band gaps, thereby forming a series of solar cells, referred to as "multijunction," "cascade," or "tandem" solar cells. Multijunction solar cells are made by connecting a plurality (e.g., two, three, four, etc.) P-N junction solar cells in series, thereby achieving more efficient solar cells over single P-N junction solar cells. Tandem cells are typically formed using higher gap materials in the top cell to convert higher energy photons, while allowing lower energy photons to pass down to lower gap materials in the stack of solar cells. The bandgaps of the solar cells in the stack are chosen to maximize the efficiency of solar energy conversion, where tunnel junctions are used to series-connect the cells such that the voltages of the cells sum together. Such multijunction solar cells require numerous layers of materials to be formed in a complex multijunction stacked arrangement.

SUMMARY

The disclosure relates to solar cells and, more particularly, to dilute Group III-V nitride intermediate band solar cells with contact blocking layers to be used for improved solar cell performance.

In accordance with one or more embodiments, an intermediate band (IBand) solar cell (IBSC) is provided comprising at least one p-n junction based on dilute III-V nitride materials and a pair of contact blocking layers positioned on opposite surfaces of the p-n junction. The contact blocking layers provide electrical isolation of the intermediate band of the p-n junction by blocking the charge transport in the IBand of the p-n junction without affecting the electron and hole collection efficiency of the p-n junction. In one or more embodiments, the IBSC is formed on a substrate or as a solar cell within a larger, multi-junction tandem cell.

In accordance with one or more embodiments, the dilute III-V nitride p-n junction materials for the IBSC comprise layers of GaNAs, and the contact blocking layers are lattice matched to a desired band gap of the GaNAs layers. In one or more embodiments, the contact blocking layers comprise at least one of AlGaAs or other III-V ternary alloys. In one or more embodiments, the composition of the AlGaAs contact blocking layer is tuned so that its conduction band is aligned with the upper sub-band of the GaNAs absorber layers. By isolating the IBand of the GaNAs absorber layers in this manner and effectively blocking the intermediate band from contact with neighboring layers, the IBand only acts as a "stepping stone" for the absorption of the lower energy photons and hence increases the short circuit current ($I_{SC}$) of the device. The open circuit voltage ($V_{OC}$) of a IBSC is determined by the largest gap of the GaNAs. In one or more embodiments, the p-n junction absorber layers of the IBSC may further have compositionally graded nitrogen concentrations to provide an electric field for more efficient charge collection.

Many other features and embodiments of the present invention will be apparent from the accompanying drawings and from the following detailed description.

DRAWINGS

The above-mentioned features and objects of the present disclosure will become more apparent with reference to the following description taken in conjunction with the accompanying drawings wherein like reference numerals denote like elements and in which.

DETAILED DESCRIPTION

In general, the present disclosure is directed to a photovoltaic device, solar cell or intermediate band solar cell (IBSC) having improved solar power conversion efficiency through the use of a single semiconductor with multiple band gaps. In a semiconductor including such an intermediate band, an additional one or more bands in the band gap of a wide gap semiconductor serve as "stepping stones" to transfer electrons from the valence to the conduction band with two or more photons of energy smaller than the band gap. This IBSC concept requires only a single p/n junction but the intermediate bands have to be electrically isolated from charge collecting contacts. Theoretical modeling predicts power conversion efficiency of 63% for a device with one and 72% for a device with two intermediate bands.

More particularly, the present disclosure is directed to dilute Group III-V nitride intermediate band solar cells (IBSCs) having contact blocking layers providing improved solar cell performance. The substitution of small amount of nitrogen in a III-V semiconductor alloy (such as GaAs, InGaAs, or GaAsP) splits the conduction band of the alloy into a higher conduction band ($E_C$) and a lower subband, or the intermediate band (IBand). By utilizing a photovoltaic device, solar cell or IBSC including dilute Group III-V nitride layers and also contact blocking layers, the IBSC of the present disclosure is able to maximize solar cell performance, increase voltage and current within an IBSC and also prevent electrons and holes from escaping the layers through conduction in the IBand of an IBSC. Certain embodiments of the present disclosure will now be discussed with reference to the aforementioned figures, wherein like reference numerals refer to like components.

By utilizing an IBSC, a single P-N junction may be employed, thereby lowering production costs by considerably simplifying the solar cell design over more complex multijunction solar cells. Further, the IBSC will achieve greater power conversion efficiencies over conventional single P-N junction solar cells by fabricating the IBSC using materials that optimize three or more energy bands in order. Conventionally, finding a multiband semiconductor absorber layer and electrically isolating the IBand in the absorber layer has been a challenge. IBSC test devices using InAs quantum dots (QD) miniband concept and dilute III-V nitride result in low open circuit voltage ($V_{OC}$) readings, e.g. 0.3-0.4 eV. These lower $V_{OC}$ readings occurred for conventional IBSCs either because of non-ideal band separation (as in the InAs QD concept) or because electrons and holes continuously leave the layers of an IBSC through conduction in the IBand due to the lack of electrical isolation of the IBand in the absorber layer in the IBSC with the neighboring layers. The present inventors have solved these electrical isolation issues surrounding IBSCs using the concept of band anti-crossing in highly mismatched alloys (HMAs) which enables the usage of II-VI and III-V semiconductor alloys that have a multiband structure appropriate for IBSC applications.

Figure 1:
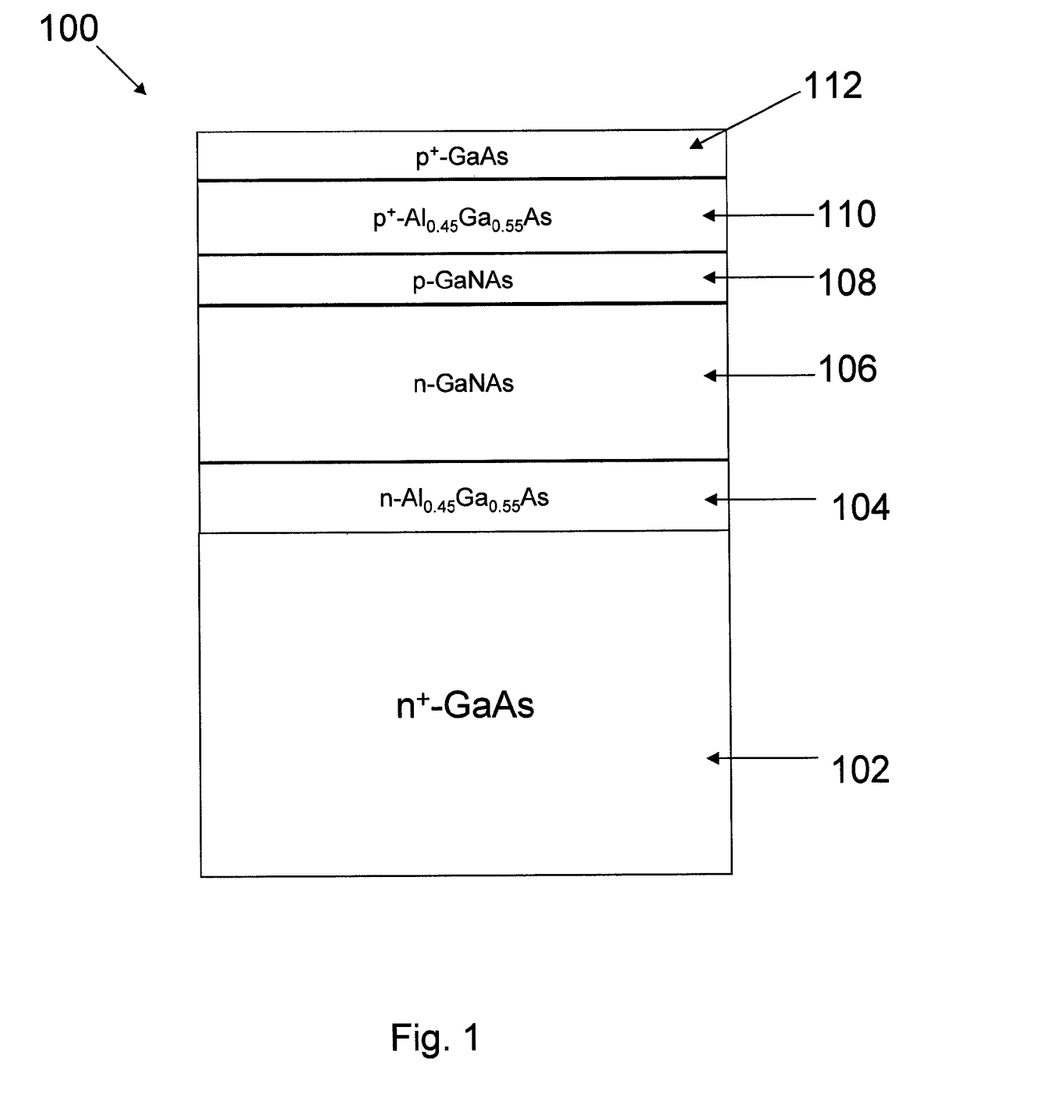
FIG. 1 is a block diagram representation of an intermediate band solar cell (IBSC) in accordance with one or more embodiments of the present disclosure.

Referring now to FIG. 1, a block diagram illustration of an intermediate band solar cell (IBSC) 100 is shown generally in accordance with one or more embodiments of the present disclosure. IBSC 100 includes a bottom substrate layer 102 formed of any substrate material commonly used in solar cells. For example, substrate layer 102 may comprise Germanium (Ge) or Galium Arsenide (GaAs) and substrate layer 102 may comprise an n-type or p-type material as desired for a particular application.

IBSC 100 includes two layers 106 and 108 of dilute III-V nitride materials that comprise a single P-N junction for IBSC 100 having multiple energy bands, wherein n-type material is formed on one side of the P-N junction and p-type material is formed on the other side of the P-N junction. In one or more embodiments, P-N junction layers 106 and 108 comprise respective layers of GaNAs. In the particular embodiment illustrated in FIG. 1, layer 106 is formed as n-GaNAs and layer 108 is formed as p-GaNAs, while it is understood that the order of these p-type and n-type layers could be reversed for different applications (e.g., see FIG. 8). GaNAs P-N junction layers 106 and 108 may also be referred to herein as GaNAs absorber layers 106 and 108. In one or more embodiments, the nitrogen concentration within the GaNAs absorber layers 106 and 108 ranges from 0.5-5%. Other III-V nitrides that have similar multiband properties as GaNAs can also be used as IBand absorbers, such as but not limited to AlGaNAs and GaNAsP.

In one or more embodiments, Indium (In) may be added to at least one of the layers 106 and 108 so as to form a GaInNAs layer 106 or GaInNAs layer 108 in order to improve the lattice-matching parameters of the material, which improves the overall quality of the material and reduces material-based defects that could occur from routine usage and testing that could otherwise harm the efficiency of the IBSC 100. In one or more embodiments, the proportion of Nitrogen (N) to Indium (In) in layers 106 and 108 is selected to have a 1:3 ratio, in order to yield optimal results and to compensate for the Nitrogen-induced contraction of the lattice parameter caused by the presence of Nitrogen in a compound.

In one or more embodiments, a pair of contact blocking layers 104 and 110 are positioned on opposite surfaces of the P-N junction in IBSC 100, such that a first contact blocking layer 104 is formed on substrate layer 102 adjacent to n-GaNAs layer 106 and a second contact blocking layer 110 is formed on p-GaNAs layer 108. While a pair of contact blocking layers 104 and 110 are illustrated in FIG. 1, it is further understood that IBSC 100 may be formed in some embodiments with only one of the contact blocking layers 104 and 110 formed adjacent to the n-type of the layers 106 and 108. Thus, at least one contact blocking layer (i.e., 104 or 110) is formed adjacent to the n-type of the layers 106 and 108, while in some embodiments another contact blocking layer (i.e., 104 or 110) may further be formed adjacent to the p-type of the layers 106 and 108. Contact blocking layers 104 and 110 may be formed of any material that provides electrical isolation of the intermediate band of the GaNAs P-N junction by blocking the charge transport in the intermediate band of the GaNAs P-N junction between layers 106 and 108 without affecting the electron and hole collection efficiency of the GaNAs P-N junction.

In one or more embodiments, contact blocking layers 104 and 110 are lattice matched to a desired higher band gap of the GaNAs layers 106 and 108. In one or more embodiments, the contact blocking layers comprise at least one of AlGaAs materials. When holes and electrons are formed in the GaNAs P-N junction layers 106 and 108 upon exposure to solar radiation, it is desirable that the holes and electrons travel across the P-N junction between layers 106 and 108 through the valence band and the higher conduction band, respectively of the layers 106 and 108 to generate the resultant current in IBSC 100. The contact blocking layers 104 and 110 electrically isolate the IBand and block the passage of electrons into the adjacent layers of IBSC 100 through the IBand. In one or more embodiments, the composition of the GaNAs P-N junction layers 106 and 108 and the AlGaAs contact blocking layers 104 and 110 are tuned to align the conduction band of the contact blocking layers 104 and 110 with the higher conduction band of the GaNAs P-N junction layers 106 and 108. By isolating the IBand of the GaNAs P-N junction layers 106 and 108 in this manner and effectively blocking the IBand from contact with neighboring layers of IBSC 100, increased open circuit voltage ($V_{OC}$) dependent on the larger gap the absorber layer is achieved. The photocurrent can be further increased by utilizing the isolated Band to absorb photons with energy below the band gap of the GaNAs P-N junction layers 106 and 108.

In one or more embodiments, as illustrated in FIG. 1, a n AlGaAs blocking layer 104 is formed on a GaAs substrate layer 102. An n-type GaNAs layer 106 is formed on the n-AlGaAs blocking layer 104, where the n-AlGaAs blocking layer 104 is lattice-matched with its adjacent layers in order to maximize the overall quality of the material used, which in turn minimizes any material-based defects that occur from routine usage or testing that would otherwise harm efficiency of the IBSC 100. A p-type GaNAs layer 108 is formed on the n-type GaNAs layer 106. A $p^+$ $Ga_yAs$ layer 112 is formed on the p+-AlGaAs layer 110 in order to protect the AlGaAs layer from oxidation. For either of the blocking layers 104 and 110 described in any of the embodiments, an appropriate n-type or p-type layer of GaInP or any other layer of material known to those skilled in the art exhibiting similar blocking characteristics may be interchangeably utilized in place of AlGaAs.

In IBSC 100 of FIG. 1, the bottom blocking layer 104 lets electrons through the higher conduction band but blocks holes while the top blocking layer 110 lets holes through but blocks electrons from either the IBand or the conduction band. When released in response to exposure to solar radiation, electrons wish to travel from the first P-N junction layer 106 through the first blocking layer 104 to the bottom substrate layer 102, so the first blocking layer 104 facilitates this process. Likewise when released in response to solar radiation, holes wish to travel from the second P-N junction layer 108 to the protective layer 112, such that the top blocking layer 110 facilitates this process. As will be further discussed in the graphical illustrations of the band diagrams in FIG. 2, the blocking layers 104 and 110 enable the electrical isolation of the intermediate band of GaNAs absorber layers 106 and 108, which in turn maximizes the voltage and the current flow throughout the entire IBSC 100 and hence optimizes the overall efficiency of the IBSC 100.

Figure 2:
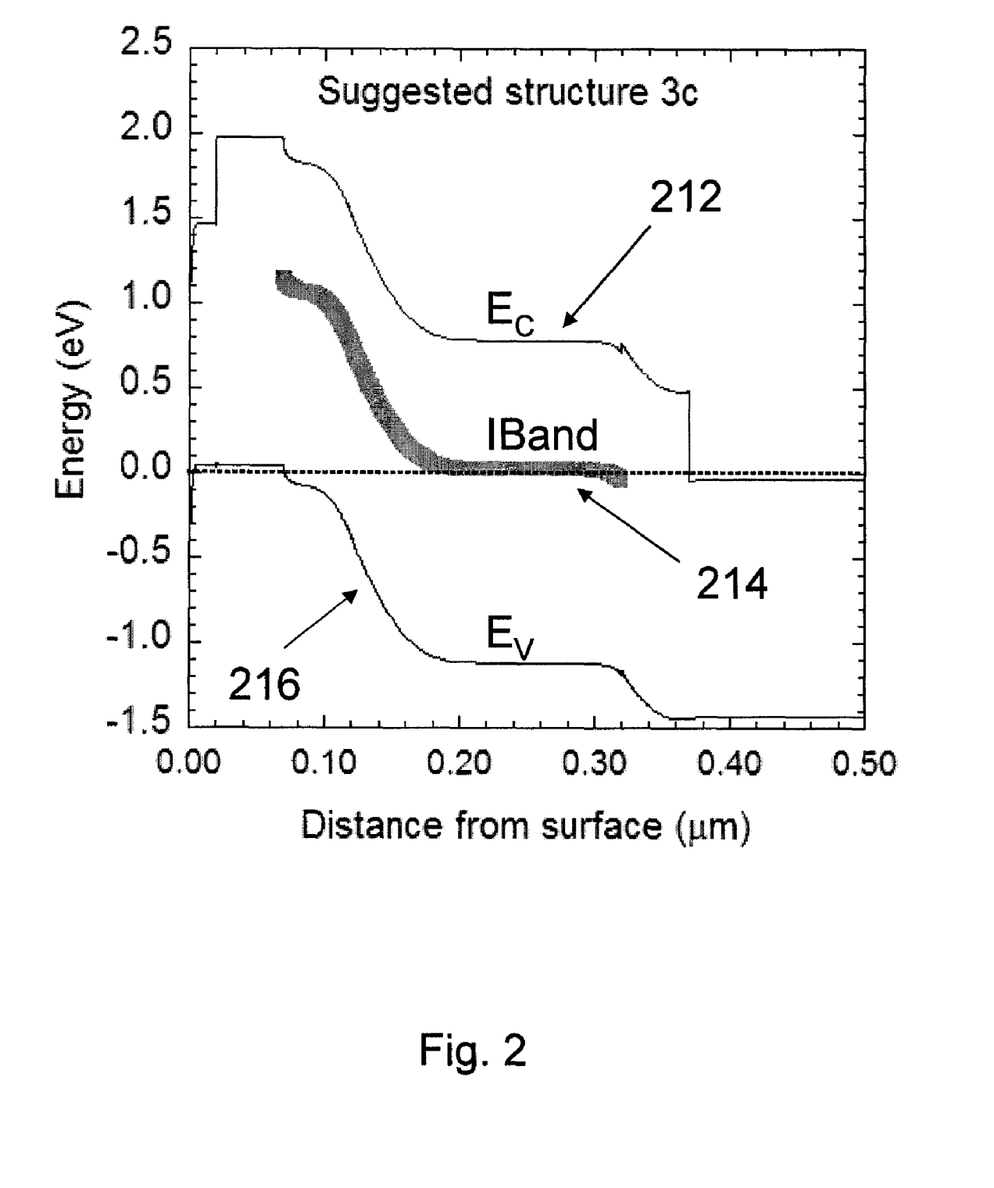
FIG. 2 is a graphical illustration of a calculated band diagram for one embodiment of the IBSC shown in FIG. 1, in accordance with one or more embodiments of the present disclosure.

Referring now to FIG. 2, a graphical illustration of the calculated band diagram for one specific embodiment of the IBSC 100 of FIG. 1. In this representative example, a 100 nm n-AlGaAs blocking layer 104 with 45% Al having an n doping ~$2\times10^{17}$ $cm^{-3}$ is formed on an $n^+$ GaAs substrate layer 102. A 400 nm n-type GaNAs layer 106 that is Te doped $2\times10^{17}$ $cm^{-3}$ is formed on the n-AlGaAs blocking layer 104, and a 100 nm p-type GaNAs layer 108 that is Zn doped $1\times10^{18}$ $cm^{-3}$ is formed on the n-type GaNAs layer 106. Next, a 50 nm $p^+$ $Al_{0.75}Ga_{0.25}As$ blocking layer 110 is formed on the p-type GaNAs layer 108. Finally, a 20 nm thick $p^+$GaAs layer 112 is formed on the $p^+$ $Al_{0.75}Ga_{0.25}As$ blocking layer 110 to protect this layer from oxidation.

The calculated band diagram of FIG. 2 illustrates plots for the conduction band ($E_C$) 212, the intermediate band (IBand) 214, and the valence band ($E_V$) 216. The x-axis of the calculated band diagram represents the distance from the surface of the structure in FIG. 1 in micron while the y-axis represents an energy measurement reading in units of eV (electron-volts) measured with respect to the Fermi energy level. The conduction band ($E_C$) 212 represents the energy band with empty states for electron conduction to occur, and the slope of the conduction band ($E_C$) 212 can reveal the rate of electron flow or charge transport throughout the IBSC 100. Similarly, the valence band ($E_V$) 216 represents the energy band that is filled with electrons or with empty states for hole conduction, and the slope of the valence band ($E_V$) 216 can reveal the rate of hole flow or charge transport throughout the IBSC. As can be seen in FIG. 2, the slope of both plots 212 and 216 show the electrons being repelled from the surface whereas holes are being drawn to the surface. The IBand plot 214 represents the intermediate band formed as a result of the anticrossing interaction between the N states and the GaAs conduction band ($E_C$) 212. The IBand 214 in FIG. 2 is completely isolated in both sides and only acts as a "stepping stone" for the absorption of low energy photons.

Referring back to FIG. 1, in one or more embodiments, IBSC 100 may be formed with the protective layer 112, such as $p^+$ GaAs or the like, deposited on top of the contact blocking layer 110 for providing a protective covering over the other layers and to prevent the second blocking layer 110 from oxidizing, especially if the second blocking layer 110 is made from $Al_xGa_yAs$. Layer 112 may also function as a low resistance contact. The protective layer 112 may usually comprise n-type or p-type GaAs, depending on the desired configuration of the various layers of IBSC 100 for desired operation characteristics. In one or more embodiments, the protective layer 112 may optionally be deposited using known deposition techniques at a thinner thickness compared to the other layers of IBSC 100.

Figure 3:
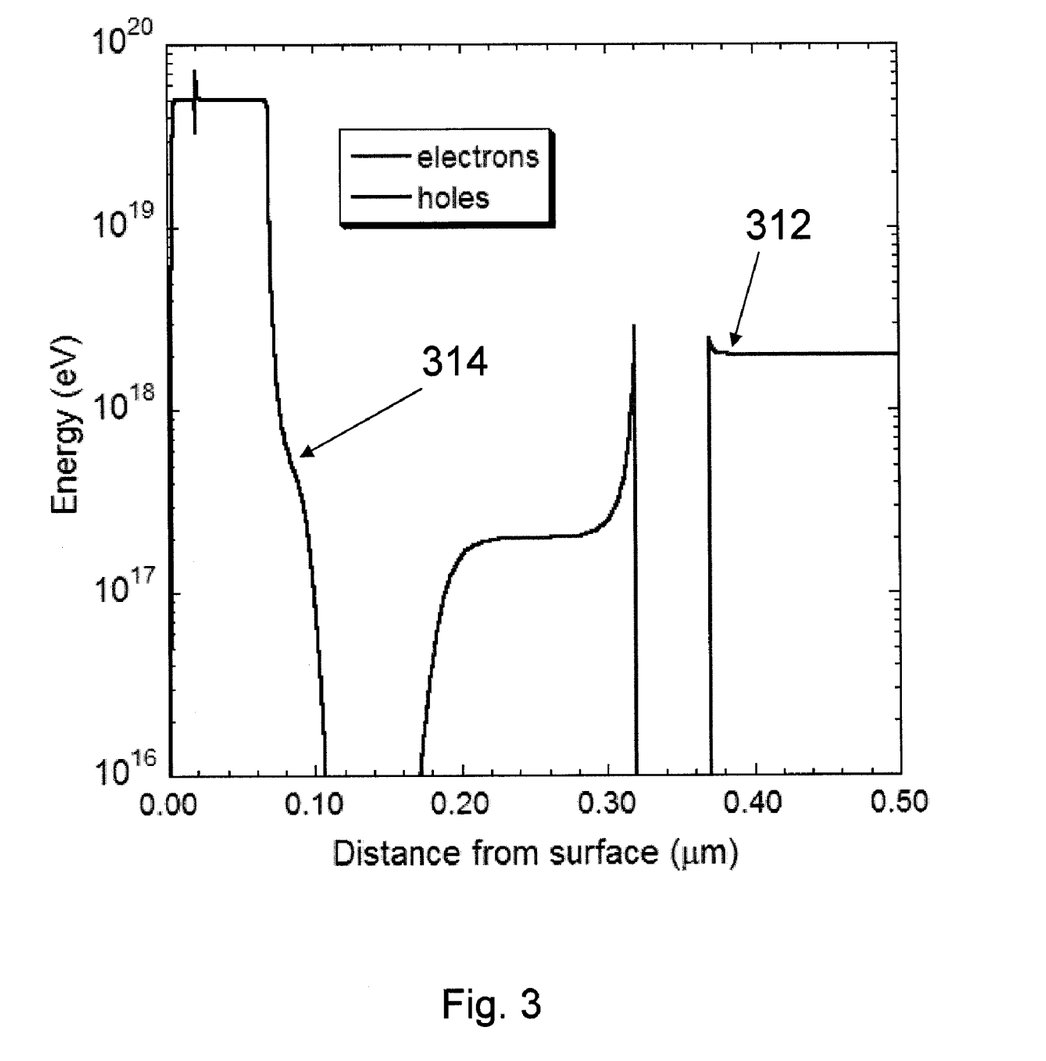
FIG. 3 is a graphical illustration of a calculated carrier profiles for one embodiment of the IBSC shown in FIG. 1, in accordance with one or more embodiments of the present disclosure.

Referring now to FIG. 3, a graphical illustration of the carrier concentration profiles of the IBSC 100 of FIG. 1 is shown in accordance with one or more embodiments of the present disclosure. Carrier concentration profile graph of FIG. 3 has an x-axis describing the distance from the surface in μm, and carrier concentration on the y-axis in units of ($cm^{-3}$). The carrier concentration profile graph illustrates a carrier concentration plot of electrons 312 and a carrier concentration plot of holes 314. As can be seen from these plots of FIG. 3, the concentration of holes is highest near the surface, shown by activity in the holes plot 314, where top blocking layer 110 resides, wherein top blocking layer 110 lets holes through but blocks electrons. Then, farther away from the surface both hole and electron concentration become very small in the p/n junction depletion region extending from 0.1 to 0.18 μm. Deeper on the n-type side of the IBSC structure 100, the concentration of holes is negligibly small and the plot 312 represents the concentration of electrons. The intermediate band electrons in the thickness range 0.18 to 0.32 μm in layer 106 (FIG. 1) are electrically isolated from the back contact by the blocking layer 104. Only the electrons that are excited from the intermediate band 212 (FIG. 2) to the upper band 214 can be transferred to the substrate and collected by the back contact. Therefore, the carrier concentration profile graph of FIG. 3 shows that the blocking layers function properly and work effectively as blockers of electrons and holes, which electrically isolates the IBand improving the current, voltage and the overall power conversion efficiency of IBSC 100.

Figure 4:
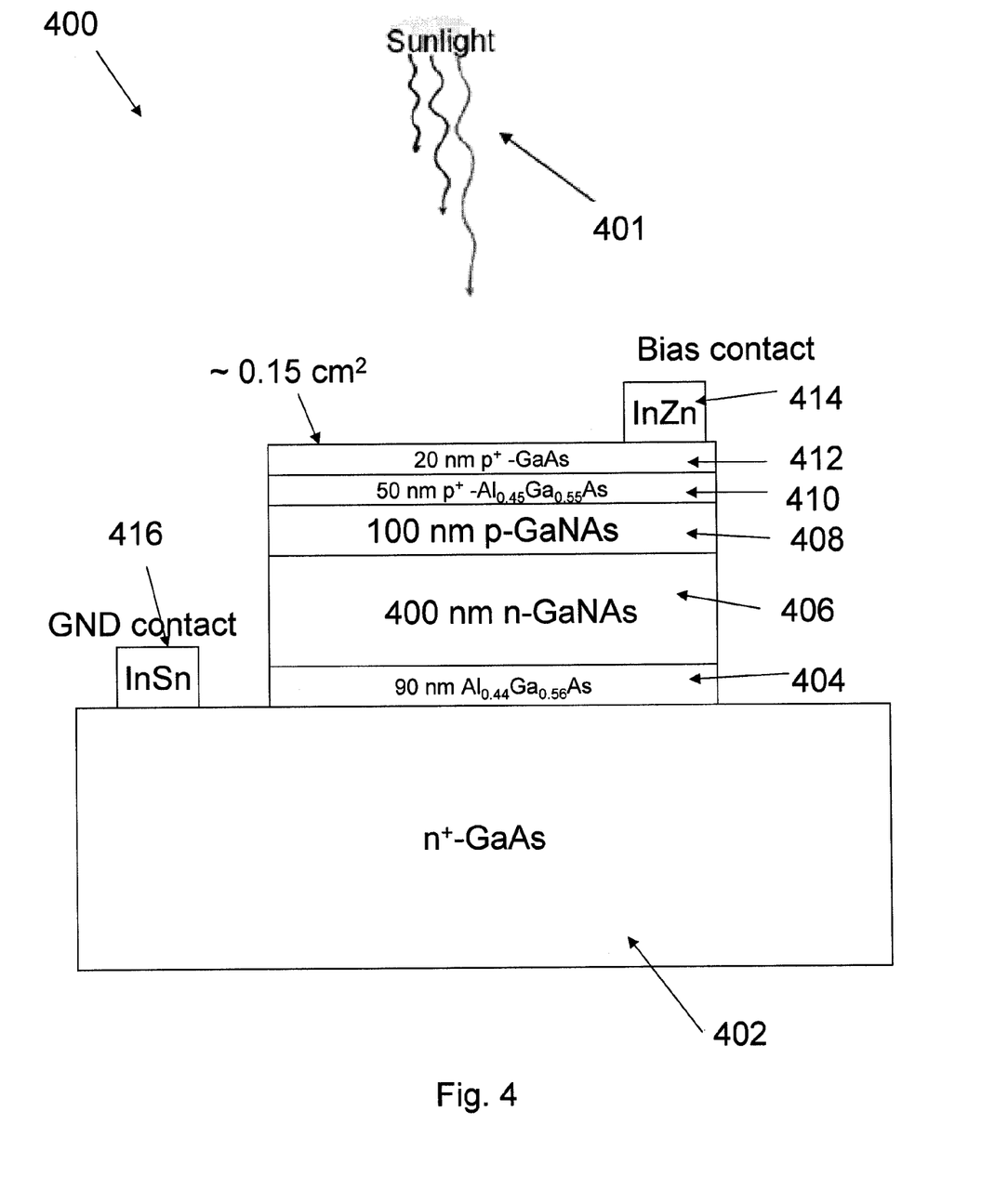
FIG. 4 a block diagram representation of a test structure of an intermediate band solar cell (IBSC) in accordance with one or more embodiments of the present disclosure.

Referring now to FIG. 4, a block diagram representation of a test device structure of an IBSC 300 having metal contacts 414 and 416 and being exposed to sunlight 401 is shown generally in accordance with one or more embodiments of the present disclosure. IBSC 400 includes a 90 nm n $Al_{0.44}Ga_{0.56}As$ blocking layer 404 is formed on an $n^+$ GaAs substrate layer 402. A 400 nm n-type GaNAs layer 406 is formed on the n AlGaAs blocking layer 404, and a 100 nm $p^+$-type GaNAs layer 408 is formed on the n-type GaNAs layer 406. A 50 nm $p^{++}Al_{0.45}Ga_{0.55}As$ blocking layer 410 is formed on the GaNAs layer 408 and finally a 20 nm p+-GaAs protective contact layer 412 is formed on the AlGaAs blocking layer 410. An InZn bias contact 414 is formed on the protective layer 412 with an InSn ground contact 416 being formed on a portion of the substrate layer 302. Bias contact 414 serves as a contact for a voltage or voltage source, and ground contact 416 serves as a contact for a grounding voltage. Bias contact 414 may comprise InZn (Indium Zinc) and ground contact 416 may comprise InSn (Indium Tin) in this particular embodiments, while it is understood that other ohmic contact metallizations to p-type and n-type GaAs providing similar desired characteristics could be utilized for any of the respective layers and components of IBSC 400.

Figure 5:
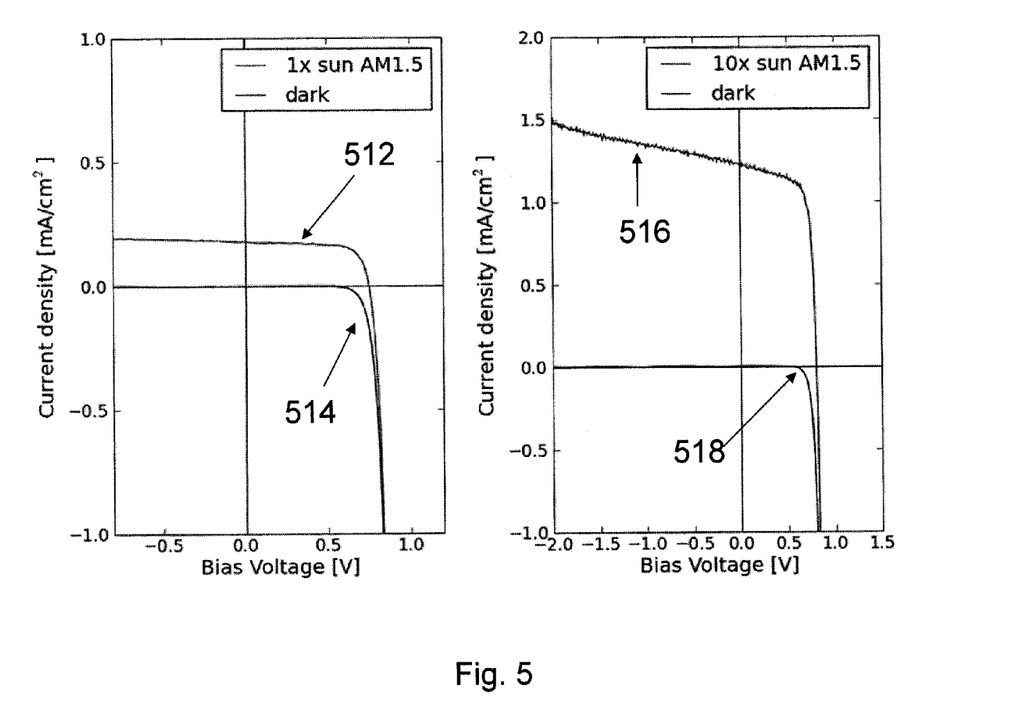
FIG. 5 is a graphical illustration of the measured current density under 1× sun and 10× sun of one embodiment of the IBSC shown in FIG. 4, in accordance with one or more embodiments of the present disclosure.

Referring now to FIG. 5, a graphical illustration of the current-voltage I-V characteristics measurements in the dark and under 1× and 10× sun illumination for the IBSC 400 of FIG. 4 is shown in accordance with one or more embodiments of the present disclosure. I-V characteristics plots of FIG. 5 show a bias voltage (in V) for its x-axis and a current density, measured in $mA/cm^2$, as its y-axis. Plot 512 shows the I-V characteristics of IBSC 400 of FIG. 4 upon exposure to 1× sun AM1.5, while plot 514 shows the I-V characteristics when IBSC 400 is shielded from the sun (i.e., dark). Similarly, plot 516 shows the I-V characteristics of IBSC 400 of FIG. 4 upon exposure to 10× sun AM1.5, while plot 518 shows the I-V characteristics when IBSC 400 is shielded from the sun (i.e., dark). As can be clearly seen in FIG. 5, when IBSC 400 is exposed to sun for given voltage biases, the current increases drastically, thereby illustrating that the IBSC 400 functions properly as it turns photons into electrons and current. The $V_{OC}$, the voltage at zero current under illumination for the 1× and 10× sun condition are 0.75, and 0.8 eV, respectively. These values of $V_{OC}$ are much higher than those for unblocked structures reported in the literature (0.3-0.4 eV).

Figure 6:
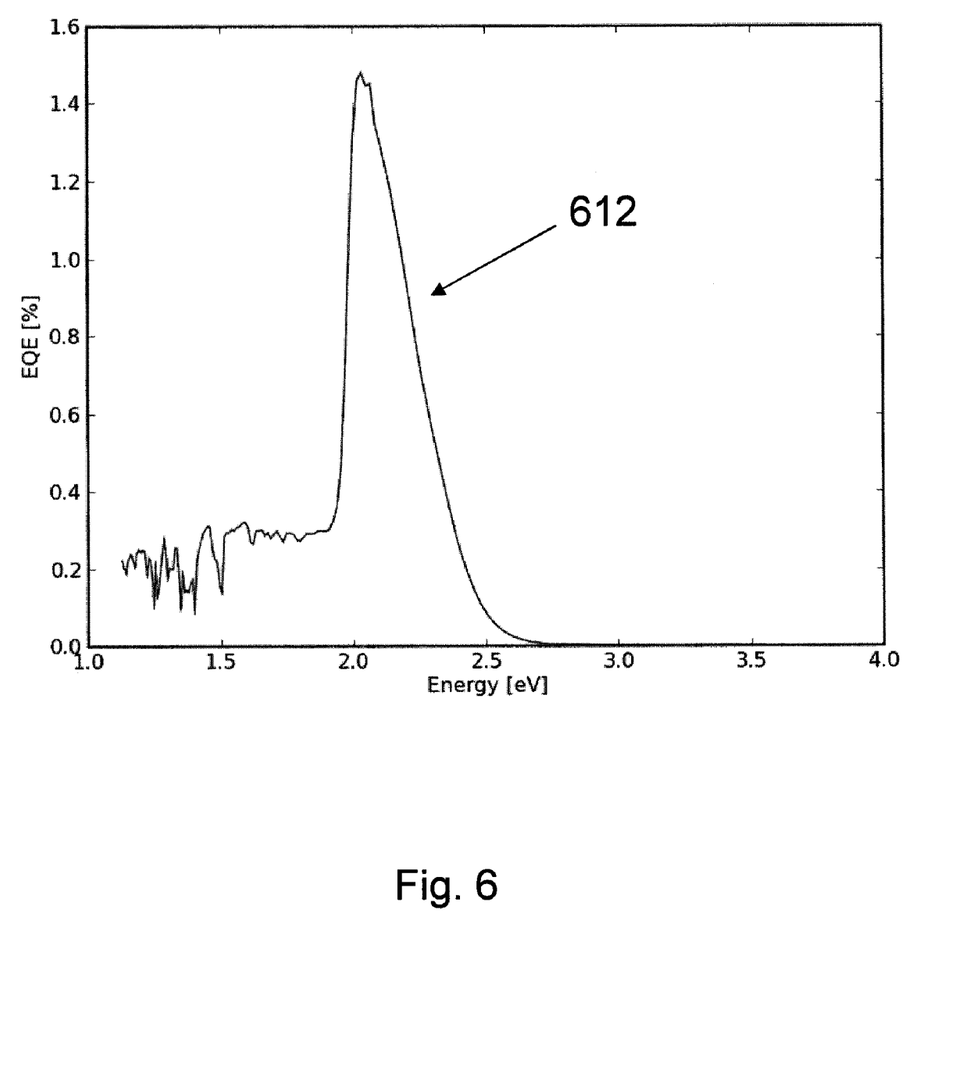
FIG. 6 is a graphical illustration of the measured External Quantum Efficiency (EQE) reading of one embodiment the IBSC shown in FIG. 4, in accordance with one or more embodiments of the present disclosure
Figure 7A:
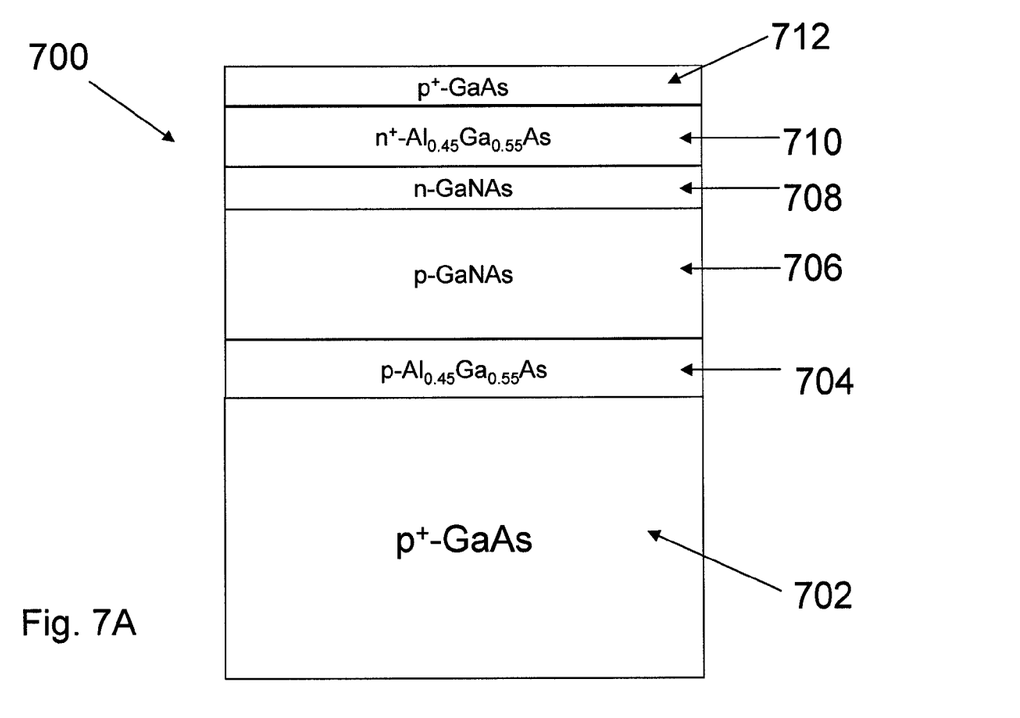
FIG. 7A is a block diagram representation of an intermediate band solar cell (IBSC) with p-type absorber layer in accordance with one or more embodiments of the present disclosure.
Figure 7B:
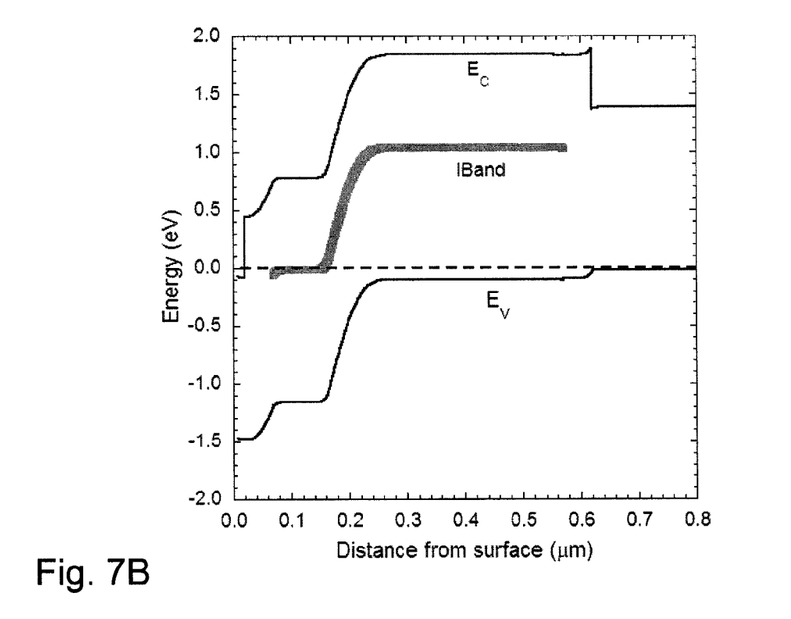
FIG. 7B is a graphical illustration of a calculated band diagram for one embodiment of the IBSC shown in FIG. 7A, in accordance with one or more embodiments of the present disclosure.

Referring now to FIG. 6, a graphical illustration of the External Quantum Efficiency (EQE) reading of the IBSC 400 of FIG. 4 is shown in accordance with one or more embodiments of the present disclosure. EQE graph of FIG. 6 illustrates the energy of the exciting monochromatic light in eV along its x-axis and an photovoltaic response EQE in percentage (%) along its y-axis. EQE plot 612 shows the effective blocking of the intermediate band by usage of the blocking layers discussed above. High EQE values are achieved only when the exciting light reaches the energy separation between the valence band and the higher conduction band of the GaNAs layer ~2 eV.

Figure 8A:
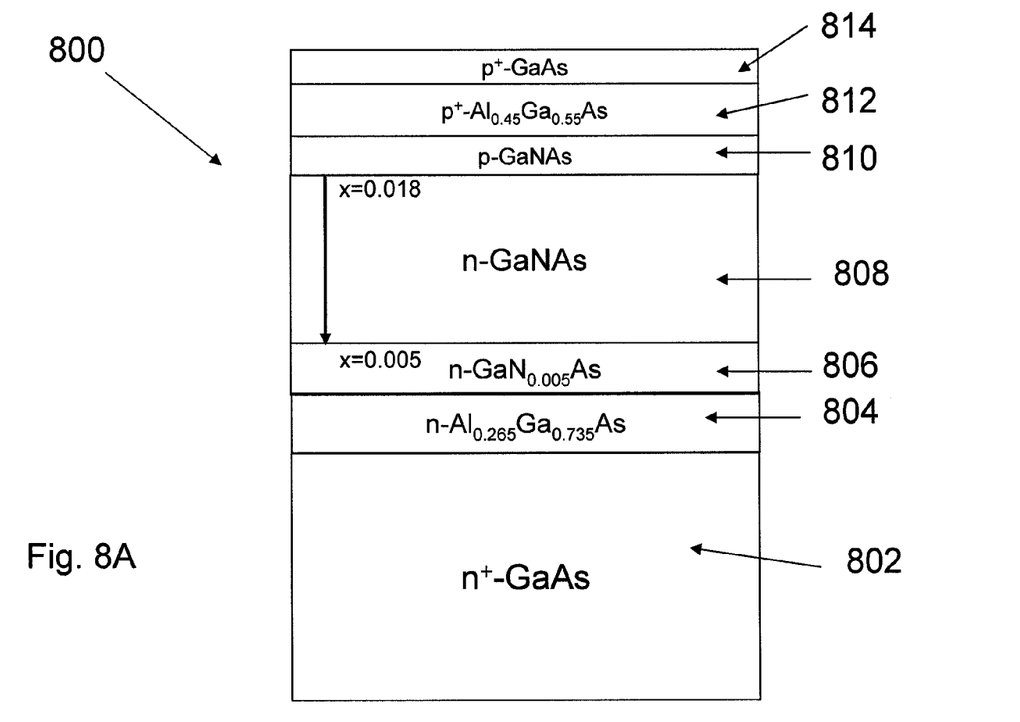
FIG. 8A is a block diagram representation of an intermediate band solar cell having graded compositions (graded IBSC) in accordance with one or more embodiments of the present disclosure.

In one or more embodiments, the nitrogen concentration x in at least one or both of the GaNAs absorber layers of the P-N junction of an IBSC 800 can be compositionally graded in order to improve the performance of the IBSC 700 as illustrated in FIG. 8A. Either or both of the GaNAs layers 808 and 810 (which correspond to GaNAs absorber layers 106 and 108) can be graded from a higher nitrogen concentration x of ~0.02 in one portion of the GaNAs layer 808 or 810 to a lower nitrogen concentration of x~0.005 in another portion 806 of the same GaNAs layer 808 or 810. For example, within the GaNAs layer 808, the N concentration decreases from x=0.018 near the interface between $GaN_{0.018}As$ layers 808 and 810 to x=0.005 near the interface between $GaN_{0.005}As$ layer 808 and blocking layer 804. In one or more embodiments, the portions of the GaNAs layers 808 and 810 closest to their junction will have the highest concentration of nitrogen. By compositionally grading at least one of the GaNAs layers 808 and 810, an additional potential is created that drives electrons toward the n-GaAs substrate 802, thereby increasing cell current. Further, the compositional grading of GaNAs layers 808 and 810 will provide a larger gap at their surfaces, thereby likely forming a better hole-conducting contact. These advantages associated with the compositional grading will further increase the solar power conversion efficiency of this type of solar cell.

Figure 8B:
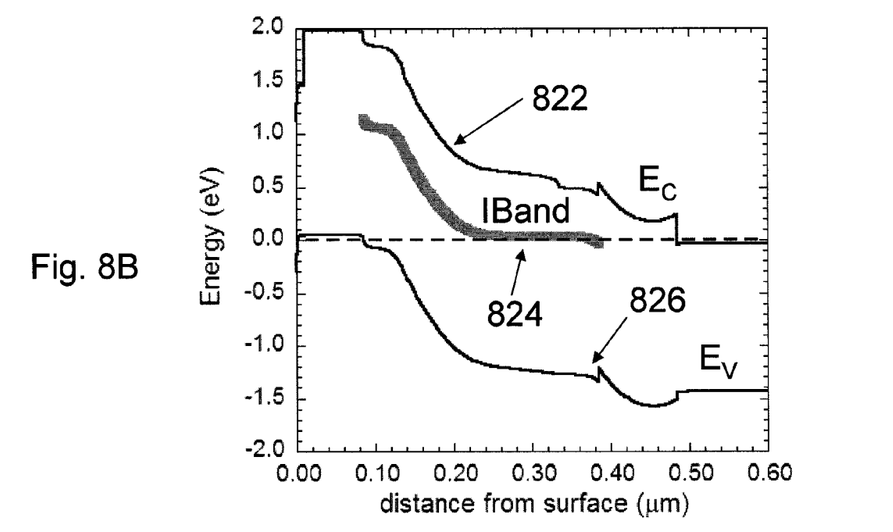
FIG. 8B is a graphical illustration of a calculated band diagram for one embodiment of the graded-IBSC shown in FIG. 8A, in accordance with one or more embodiments of the present disclosure.

Referring now to FIG. 8B, a graphical illustration of the calculated band diagram for the IBSC 800 of FIG. 8A is shown in accordance with one or more embodiments of the present disclosure. The calculated band diagram of FIG. 8B includes plots for the conduction band ($E_C$) 822, the intermediate band (IBand) 824, and energy of the valence band ($E_V$) 826. It can be seen from these band diagrams that the intermediate band 824 is effectively isolated from the conduction band ($E_C$) of the substrate and the top contact layer. When comparing the band diagrams of the graded structure, shown in FIG. 8B, with those of the non-graded structure, shown in FIG. 2, it can be seen from the band diagrams of FIG. 8 that the conduction band ($E_C$) 822 and the valence band ($E_V$) 826 of the graded structure have greater slopes in the absorber layer than the corresponding conduction band ($E_C$) 212 and the valence band ($E_V$) 214 of the non-graded structure, thereby showing the additional potential created in the graded structure that drives electrons away from the p-n junction.

In accordance with one or more embodiments, an intermediate band solar cell (IBSC) is provided that utilizes dilute Group III-V nitride intermediate band materials and contact blocking layers in order to improve solar cell performance. Specifically, overall advantages of the present disclosure include being able increase the open circuit voltage values, increase the photocurrent generated by increased light absorption through the isolated IBand, and hence ultimately being able to improve the overall power conversion efficiency and performance of a IBSC by effectively isolating the IBand using blocking layers. Furthermore, because an IBSC is utilized, only a single P-N junction is required, which, along with contact blocking layers, considerably simplifies cell design and thus significantly lowers production costs in comparison with multijunction designs.

While an intermediate band solar cell using grading compositions and contact blocking layers has been described in terms of what are presently considered to be the most practical and preferred embodiments, it is to be understood that the present disclosure need not be limited to the above embodiments. It should also be understood that a variety of changes may be made without departing from the essence of the invention. For example, materials other than those described in the various embodiments may be utilized for the various layers of the IBSC as long as they provide the desired characteristics achieved by the materials described in the various embodiments. Such changes are also implicitly included in the description and still fall within the scope of the present disclosure. It should be understood that this disclosure is intended to yield a patent covering numerous aspects of the invention both independently and as an overall system and in both method and apparatus modes.

Further, each of the various elements of the invention and claims may also be achieved in a variety of manners. This disclosure should be understood to encompass each such variation, be it a variation of an embodiment of any apparatus embodiment, a method or process embodiment, or even merely a variation of any element of these. Particularly, it should be understood that the words for each element of the invention may be expressed by equivalent apparatus terms or method terms. Such equivalent, broader, or even more generic terms should be considered to be encompassed in the description of each element or action. Such terms can be substituted where desired to make explicit the implicitly broad coverage to which this invention is entitled.

It should be understood that all actions may be expressed as a means for taking that action or as an element which causes that action. Similarly, each physical element disclosed should be understood to encompass a disclosure of the action which that physical element facilitates. The above is intended to cover various modifications and similar arrangements included within the spirit and scope of the below appended claims, the scope of which should be accorded the broadest interpretation so as to encompass all such modifications and similar structures and/or method steps. Therefore, the present invention includes any and all embodiments of the following below appended claims.

The invention claimed is:

1. An intermediate band solar cell comprising:
a p-n junction including a p-type layer and an n-type layer, each of the p-type and n-type layers comprising a dilute III-V nitride material including a higher conduction band and an intermediate band; and
a contact blocking layer positioned on an outer surface of the n-type layer comprising a material that provides electrical isolation of the intermediate band of the p-type and n-type layers by blocking the transport of holes and electrons in the intermediate band without blocking the transport of electrons in the higher conduction band.

2. The intermediate band solar cell of claim 1, further comprising a contact blocking layer positioned on an outer surface of the p-type layer, such that the contact blocking layers are positioned on opposing surfaces of the p-type and n-type layers to provide electrical isolation of the intermediate band of the p-type and n-type layers.

3. The intermediate band solar cell of claim 2, further comprising a protective layer formed on one of contact blocking layers to provide a protective covering and further provide a low resistance electrical contact.

4. The intermediate band solar cell of claim 2, wherein at least one of the contact blocking layers is lattice matched to the p-type or n-type layers.

5. The intermediate band solar cell of claim 1, wherein the p-type and n-type layers of material comprise GaNAs.

6. The intermediate band solar cell of claim 5, wherein the p-type and n-type layers of material comprise GaNAs with nitrogen concentration ranging from 0.5-5%.

7. The intermediate band solar cell of claim 1, wherein at least one of the p-type and n-type layers has a compositionally graded nitrogen concentration to provide an electric field for more efficient charge collection.

8. The intermediate band solar cell of claim 1, wherein a conduction band of the contact blocking layer is aligned with a corresponding higher sub-band of the n-type layer.

9. The intermediate band solar cell of claim 1, wherein the contact blocking layer comprises at least one of AlGaAs and InGaP.

10. The intermediate band solar cell of claim 1, wherein the p-type and n-type layers of the p-n junction and the contact blocking layer are formed from desired materials such that the intermediate band of the p-type and n-type layers will absorb photons having energy below the band gap of the p-type and n-type layers to create an increased photocurrent when the intermediate band solar cell is exposed to solar radiation.

11. An intermediate band solar cell comprising:
a substrate;
a first contact blocking layer formed on the substrate;
a p-n junction on the first contact blocking layer, wherein the p-n junction includes a p-type layer of material and an n-type layer of material with each of the p-type and n-type layers comprising a dilute III-V nitride material including a higher conduction band and an intermediate band, wherein the p-type layer of the p-n junction is formed adjacent to the first contact blocking layer; and
a second contact blocking layer formed on an opposing surface of the p-n junction from the first contact blocking layer such that the second contact blocking layer is formed adjacent to the n-type layer of the p-n junction, wherein the first and second contact blocking layers comprise materials that provide electrical isolation of the intermediate band of the p-type and n-type layers by each blocking the transport of holes and electrons in the intermediate band without blocking the transport of electrons in the higher conduction band through the second contact blocking layer and without blocking the transport of holes through the first contact blocking layer.

12. The intermediate band solar cell of claim 11, further comprising a protective layer formed on the second contact blocking layer to provide a protective covering and further provide a low resistance electrical contact.

13. The intermediate band solar cell of claim 11, wherein the p-type and n-type layers of material comprise GaNAs.

14. The intermediate band solar cell of claim 11, wherein at least one of the contact blocking layers is lattice matched to a corresponding band gap of the p-type or n-type layers.

15. The intermediate band solar cell of claim 11, wherein a conduction band of at least one of the contact blocking layers is aligned with a corresponding higher sub-band of the p-type or n-type layers with an intermediate band.

16. The intermediate band solar cell of claim 11, wherein the contact blocking layers comprise at least one of AlGaAs and InGaP.

17. The intermediate band solar cell of claim 11, wherein the p-type and n-type layers of the p-n junction and the contact blocking layers are formed from desired materials such that intermediate band of the p-type and n-type layers will absorb photons having energy below the band gap of the p-type and n-type layers to create an increased photocurrent when the intermediate band solar cell is exposed to solar radiation.

18. The intermediate band solar cell of claim 11, wherein at least one of the p-type and n-type layers has a compositionally graded nitrogen concentration to provide an electric field for more efficient charge collection.

* * * * *